(12) United States Patent
Thylen et al.

(10) Patent No.: US 8,546,898 B2
(45) Date of Patent: Oct. 1, 2013

(54) OPTOELECTRONIC LIGHT EXPOSURE MEMORY

(75) Inventors: Lars Thylen, Huddinge (SE); Alexandre Bratkovski, Mountain View, CA (US); Shih-Yuan Wang, Palo Alto, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 61 days.

(21) Appl. No.: 13/259,196

(22) PCT Filed: Sep. 29, 2009

(86) PCT No.: PCT/US2009/062589
§ 371 (c)(1),
(2), (4) Date: Sep. 23, 2011

(87) PCT Pub. No.: WO2011/053297
PCT Pub. Date: May 5, 2011

(65) Prior Publication Data
US 2012/0012810 A1    Jan. 19, 2012

(51) Int. Cl.
*H01L 27/14*    (2006.01)
*G11C 19/08*    (2006.01)
*G11C 17/06*    (2006.01)
*G11C 11/00*    (2006.01)

(52) U.S. Cl.
USPC ............... 257/431; 365/8; 365/105; 365/148

(58) Field of Classification Search
USPC .................................. 257/431; 365/110, 112
See application file for complete search history.

(56) References Cited

U.S. PATENT DOCUMENTS

| | | | | |
|---|---|---|---|---|
| 4,392,209 A | * | 7/1983 | DeBar | 365/110 |
| 5,179,533 A | * | 1/1993 | Bullington et al. | 365/110 |
| 5,327,373 A | * | 7/1994 | Liu et al. | 365/112 |
| 5,424,974 A | | 6/1995 | Liu et al. | |
| 5,948,496 A | | 9/1999 | Kinoshita et al. | |
| 6,025,857 A | * | 2/2000 | Obata et al. | 347/120 |
| 2006/0151616 A1 | * | 7/2006 | Sheats | 235/492 |
| 2006/0153486 A1 | * | 7/2006 | Sato et al. | 385/8 |
| 2008/0285329 A1 | * | 11/2008 | Shuy et al. | 365/148 |

FOREIGN PATENT DOCUMENTS

KR    10-0622268    9/2006

* cited by examiner

Primary Examiner — Long K Tran
Assistant Examiner — Dzung Tran (57) ABSTRACT

An optoelectronic memory cell has a transparent top electrode, a photoactive layer, a latching layer, and a bottom electrode. The photoactive layer absorbs photons transmitted through the top electrode and generates charge carriers. During light exposure, the latching layer changes its resistance under an applied electric field in response to the generation of charge carriers in the photoactive layer.

16 Claims, 5 Drawing Sheets

OPTOELECTRONIC LIGHT EXPOSURE MEMORY

BACKGROUND

Photography and other types of optical imaging applications rely on the ability to record the extent of light exposure. Photographic films use light-sensitive silver halide salts that turn dark when exposed to light as a way to record the light exposure. In contrast, digital photography detects and records light exposure information in electronic form. Typically, an electronic photo detector uses either charge-coupled devices (CCD) or CMOS sensors for converting light into electric signals that can be read and stored in a data storage device. The CCD and CMOS sensors require complex electronic circuits and are relatively costly to manufacture. Moreover, it is difficult to reduce the pixel sizes of such sensors to substantially increase their spatial resolution and pixel density.

BRIEF DESCRIPTION OF THE DRAWINGS

Some embodiments of the invention are described, by way of example with respect to the following figures.

DETAILED DESCRIPTION

Figure 1:
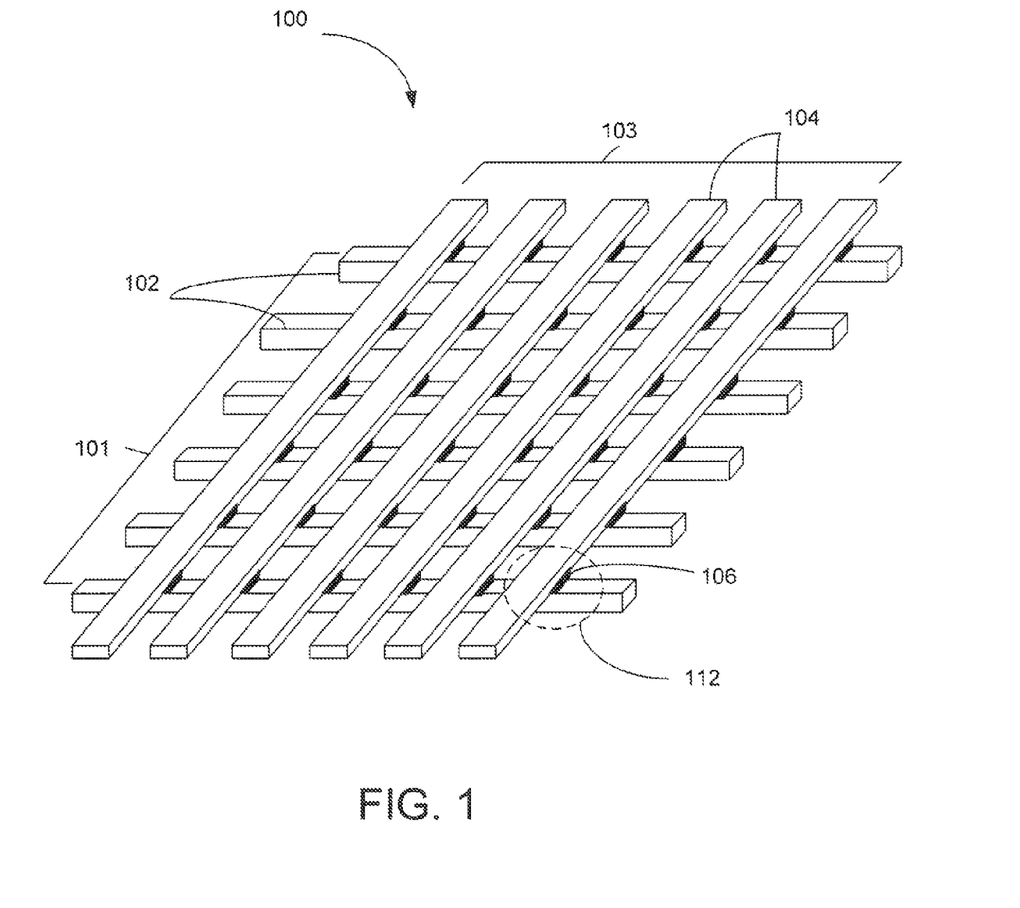
FIG. 1 is a schematic perspective view of a two-dimensional memory array comprising optoelectronic memory cells constructed according to an embodiment of the invention.

FIG, 1 shows a two-dimensional (2-D) optoelectronic memory array 100 constructed in accordance with an embodiment of the invention. As described in greater detail below, the memory array 100 has a structure that is very simple, compact, and easy to make, and is capable of recording light exposure information in a very simple way without requiring complex electronics. Moreover, the memory cells 112 in the array 100 can be made to have dimensions on the nanoscale. As a result, the memory array 100 can have a Very high pixel density and very high spatial resolution of recorded images. As used hereinafter, the term "nanoscale" means the object has one or more dimensions smaller than one micrometer.

In the illustrated embodiment, the memory array 100 is implemented in the form of a nanowire crossbar array, which has a first layer 101 of approximately parallel nanowires 102 that are laid over a second layer 103 of generally parallel nanowires 104. In this regard, a nanowire is a wire with a width on the nanoscale. The nanowires 102 of the first layer run in a direction that is at an angle to the direction in which the nanowires 104 in the second layer run. The angle may be around 90 degrees (i.e., perpendicular) or any other angle depending on the particular device layout. The two layers of nanowires 102 and 104 form a two-dimensional lattice which is commonly referred to as a crossbar structure, with each nanowire 102 in the first layer intersecting a plurality of the nanowires 104 of the second layer. As will be described in greater detail below, each intersection region 106 may be formed, in accordance with an embodiment of the invention, into a nanoscale memory cell 112 for recording light exposure.

The nanowires 102 and 104 of the first and second layers 101 and 103 may have a width and a thickness on the scale of nanometers. For example, the nanowires may have a width in the range of 15 nm to more than 1000 nm, and a thickness of 5 nm to more than 1000 nm. The nanowire layers 101 and 103 may be fabricated using well-known fabrication techniques, including various patterning, deposition, and/or etching techniques. As a feature of the embodiment, each memory cell 112 formed at an intersection 106 of the nanowires of the first and second layers 101 and 103 can be individually addressed for readout by selecting the two nanowires that form the intersection. The addressing may be done, for example, using the well-known multiplexing/demultiplexing architecture. To that end, the nanowire crossbar of the array 100 ma be connected to microscale address wire leads or other electronic leads, through a variety of different connection schemes to incorporate the nanowires into electronic circuits.

Figure 2:
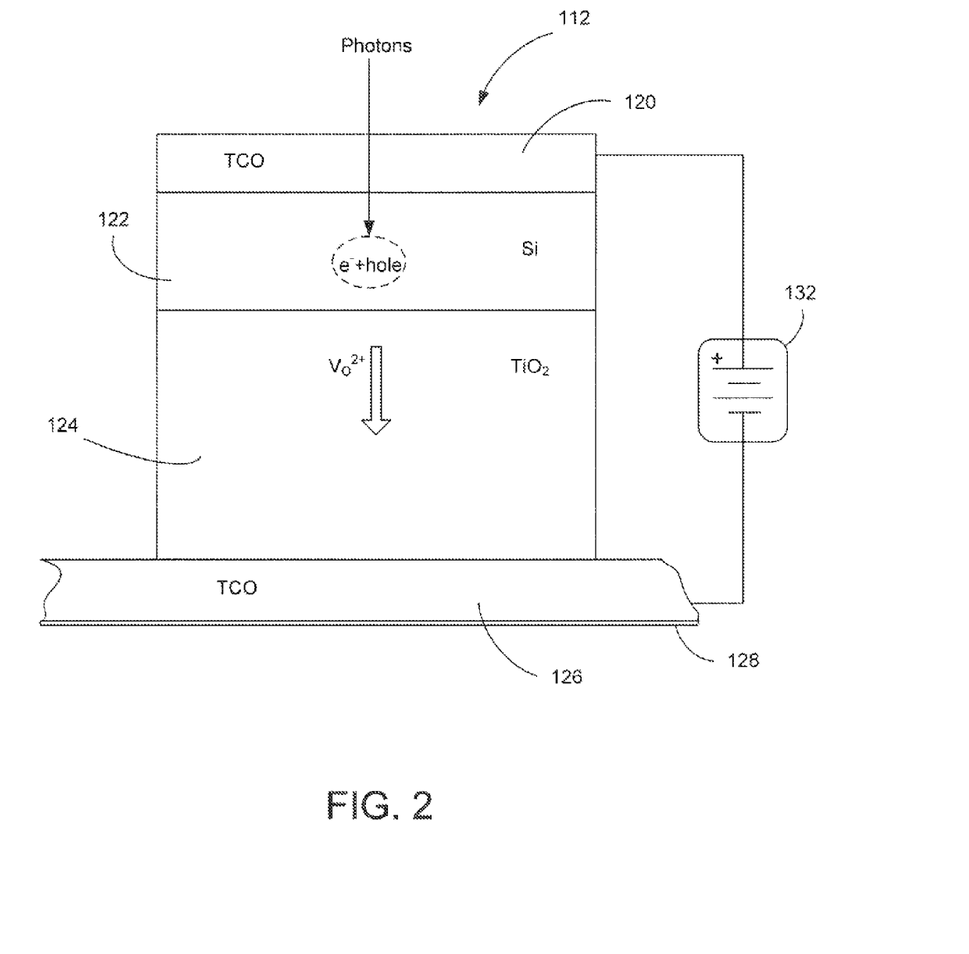
FIG. 2 is a schematic cross-sectional view of an optoelectronic memory cell in the memory array of FIG. 1.

FIG. 2 shows the structure of as memory cell 112 in the memory array 100 of FIG. 1. The memory cell 112 has a very simple structure, comprising a top electrode 120, a photoactive layer 122, a latching layer 124, and a bottom electrode 126. The top electrode 120 is a portion of a nanowire 102 in the first layer of nanowires shown in FIG. 1, while the bottom electrode 126 is a portion of a nanowire 104 in the second layer of nanowires. As illustrated, light to be sensed reaches the memory cell 112 from the top side. To allow the light to reach the photoactive layer 122, the top electrode 120 is formed of a conductive material that is transparent to the light to be detected. For detection of light in the visible range, the top electrode 120 may be made of a transparent conductive oxide (TCO), such as indium-tin oxide (ITO), or zinc oxide (ZnO). Different materials may be chosen for the top electrode if the light to be detected falls into other ranges of the optical spectrum, such as UV or infrared. The bottom electrode 126 may also be formed of a transparent conductive oxide, In one embodiment, a metal layer 128 may be formed at the bottom surface of the TCO layer to form a reflective layer to reflect light back into the photoactive layer 122 to enhance its absorption efficiency. Alternatively, the bottom electrode 126 may be formed entirely of metal, which also provides a reflective surface besides functioning as an electrode.

The photoactive layer 122 is formed of a material that absorbs the incident photons and generates charge carriers. For example, the photoactive layer 122 may be formed of Si, such as an epitaxial layer of Si, which is capable of absorbing light in the visible range. When a photon is absorbed by the Si layer, an electron-hole pair is created. The photoactive material is selected based on the light range to be detected and is not limited to Si. For instance, III-V semiconductor materials, like InP, InAs, GaAs, II-VI compounds like CdS, CdTe, group IV materials Si, Ge and their alloys SiGe, metal oxides, in amorphous, polycrystalline, or crystalline forms, are all possible candidates. The photoactive material may also be organic. Other possible candidates include nanodots and nanowires of Si, Ge, SiGe, InP, InAs, GaAs, GaN material families and metal oxide such as ZnO.

The latching layer 124 serves the function of memorizing the extent of light exposure received by the memory cell 112. To that end, the latching layer 124 has an electric property that is modified in response to the absorption of photons by the photoactive layer. In accordance with a feature of some embodiments of this invention, that electric property is the resistance of the latching layer 124. The change of the resistance of the latching layer, which depends on the generation of charge carriers in the photoactive layer 122, is used in some embodiment as an indicator of the extent of light exposure.

In particular, in some embodiments, the latching layer 124 is formed of a switching material that is capable of carrying a selected species of dopants, such that the dopants can drift through the switching material under a sufficiently strong electric field. The drifting of the dopants results in a redistribution of dopants in the switching material in the latching layer 124, and as a result the resistance across the latching layer is changed.

Generally, the switching material may be electronically semiconducting or nominally insulating and a weak ionic conductor. Many different materials with their respective suitable dopants can be used as the switching material. Materials that exhibit suitable properties for switching include oxides, sulfides, selenides, nitrides, carbides, phosphides, arsenides, chlorides, hydrides, and bromides of transition and rare earth metals. Suitable switching materials also include elemental semiconductors such as Si and Ge, and compound semiconductors such as III-V and II-VI compound semiconductors. The III-V semiconductors include, fix instance, BN, BP, BSb, AlP, AlSb, GaAs, GaP, GaN, InN, InP, InAs, and InSb, and ternary and quaternary compounds. The II-VI compound semiconductors include, for instance, CdSe, CdS, CdTe, ZnSe, ZnS, ZnO, and ternary compounds. These listings of possible switching materials are not exhaustive and do not restrict the scope of the present invention.

The dopant species used to alter the electric properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies $V_O^{2+}$, sodium, hydrogen, $NiO_x$, lithium, etc. For GaN, the dopant species may be nitride vacancies or sulfide ions. For compound semiconductors, the dopants may be n-type or p-type impurities.

By way of example, as shown in HG. 2, in one embodiment the switching material may be $TiO_2$. In this case, the dopants that may be carried by and transported through the switching material are oxygen vacancies ($V_O^{2+}$). The thickness of the switching material of the latching layer in some embodiments may be in the range of 3 nm to 100 nm, and in other embodiments about 30 nm or less.

The resistance of the latching layer 124 can be modified by controlling the concentration and distribution of the dopants in the switching material. In this regard, the latching layer 124 may be switched between an ON state which has a very small resistance, an OFF state which has a very high resistance, or be set to one of multiple intermediate states with a resistance value between those of the ON and OFF states. When a DC switching voltage is applied to the latching layer 124, an electric field is created across the switching material. This electric field, if of a sufficient strength and proper polarity, may drive the dopants to drift through the switching material towards the bottom electrode 126, thereby turning the device from the OFF state into an intermediate state or all the way into the ON state. If the polarity of the electric field is reversed, the dopants may drift in an opposite direction across the switching material and away from the bottom electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. Thus, the resistance is maintained after the switching voltage is removed. The resistance can then be read out by applying a read voltage across the switching material and detecting the current flowing through the material. The read voltage is chosen to be significantly lower than the switching voltage so that it does not cause significant ion drifting across the switching material.

The switching behavior described above may be based on different possible mechanisms. In one mechanism, the reduction of resistance may be a "bulk" property of the switching material in the switching layer. The redistribution of the dopants in the switching material causes the resistance across the switching material to fall, and this may account for the decrease of the overall resistance of the latching layer.

In another mechanism, the switching behavior may be an "interface" phenomenon. Initially, with a low dopant level in the switching material, the interface of the switching material and the bottom electrode 126 may behave like a Schottky barrier, with an electronic barrier that is difficult for electrons to tunnel through. As a result, the device has a relatively high resistance. When a switching voltage is applied to turn the device ON, the dopants drift towards the bottom electrode 126. The increased concentration of dopants in the electrode interface region changes its electric property from one like a Schottky barrier to one like an Ohmic contact, with a significantly reduced electronic barrier height or width. As a result, electrons can tunnel through the interface much more easily, and this may account for the significantly reduced overall resistance of the latching layer. It is also possible that the resistance change is the result of a combination of both the bulk and interface mechanisms.

Even though there may be different mechanisms for explaining the switching behavior, it should be noted that the present invention does not rely on or depend on any particular mechanism for validation, and the scope of the invention is not restricted by which switching mechanism is actually at work.

The operation of the memory cell 112 for light exposure measurement is now described. Initially, prior to being exposed to light, the latching layer 126 may be set in its OFF state, which has a relatively high resistance. An operating voltage from an external voltage source 132 is applied to the electrodes 120 and 126 of the memory cell 112. The photoactive layer 122 and the latching layer 124 form a voltage divider for the applied operating voltage. When there is no light, the photoactive layer 122 has a relatively high resistance. As a result, there is a substantial voltage drop across the photoactive layer 122, and the remaining voltage across the latching layer 124 is not high enough to provide an electric field strong enough to cause ion drifting in the switching material.

When the memory cell 112 is exposed to light, photons enter the memory cell through the transparent top electrode 120 and into the photoactive layer 122. The photoactive layer 122 absorbs the photons and generates charge carriers such as electron-hole pairs. The electric field created by the operating voltage applied to the electrodes 120 and 126 pulls the electrons and holes to move in opposite directions, creating an electric current flow. This causes a decrease in the voltage drop across the photoactive layer 122 and a corresponding increase in the voltage drop across the latching region 124. The operating voltage is chosen such that the increased voltage drop across the latching layer 124 is sufficiently high to cause ions in the switching material to drift, thereby changing the resistance of latching layer. The total resistance change will depend on the intensity and duration of the light exposure. Once the light exposure is terminated, the photoactive layer 122 returns to its high resistance state. As a result, the voltage across the latching layer 124 drops below the voltage needed to cause ion drifting, so the ions stop drifting through the switching material, and the resistance of the latching layer no longer changes.

The resistance of the latching layer 124, which represents a record of the light exposure, may be read by applying a read voltage to the top and bottom electrodes 120, 126 and detecting the magnitude of current flowing through the device. The read voltage is selected such that the voltage drop across the latching layer 124 is much lover than the threshold voltage required to cause drifting of the ionic dopants through the switching material. This read operation may require knowledge of the resistance of the photoactive layer, which may be obtained through a calibration operation prior to the light exposure.

After the light exposure measurement, the memory cell 112 can be reset such that the latching layer 124 is returned to its original pre-exposure state, such as the OFF state. This can be done by applying a reset voltage that is opposite in polarity to the operating voltage. The reset voltage causes the ions in the switching material to drift in a direction opposite to that during the light exposure measurement, thereby reversing the change in the resistance of the latching layer 124. To reduce the voltage required to reset the device, the memory cell 112 may be exposed to light during the reset operation so as to reduce the voltage drop across the pbotoactive layer 122.

Returning now to FIG. 1, the memory array 100 with its two-dimensional matrix of memory cells 112 is capable of capturing a two-dimensional image. Each memory cell 112 functions as one pixel of the captured image. As mentioned above, the memory cells 112 in the array may have dimensions on the nanoscale. Thus, the pixel pitch of the memory array 100 may be even smaller than the wavelength of the light detected. In other words, the memory array 100 is capable of sub-wavelength spatial resolution. The 2-D image capturing operation can be done in a parallel mode, with all memory cells recording their respective light exposure at the same time. This is done by applying the operating voltage to all memory cells at the same time. The parallel measurement capability allows the memory array 100 to capture a two-dimensional image quickly. After the light exposure, the exposure information, which is now encoded as the resistance change of each memory cell 112, can be read out serially by sequentially selecting the memory cells to sense their resistance values. The reset operation can be done in parallel, by applying the reset voltage to all memory cells at the same time.

Figure 3:
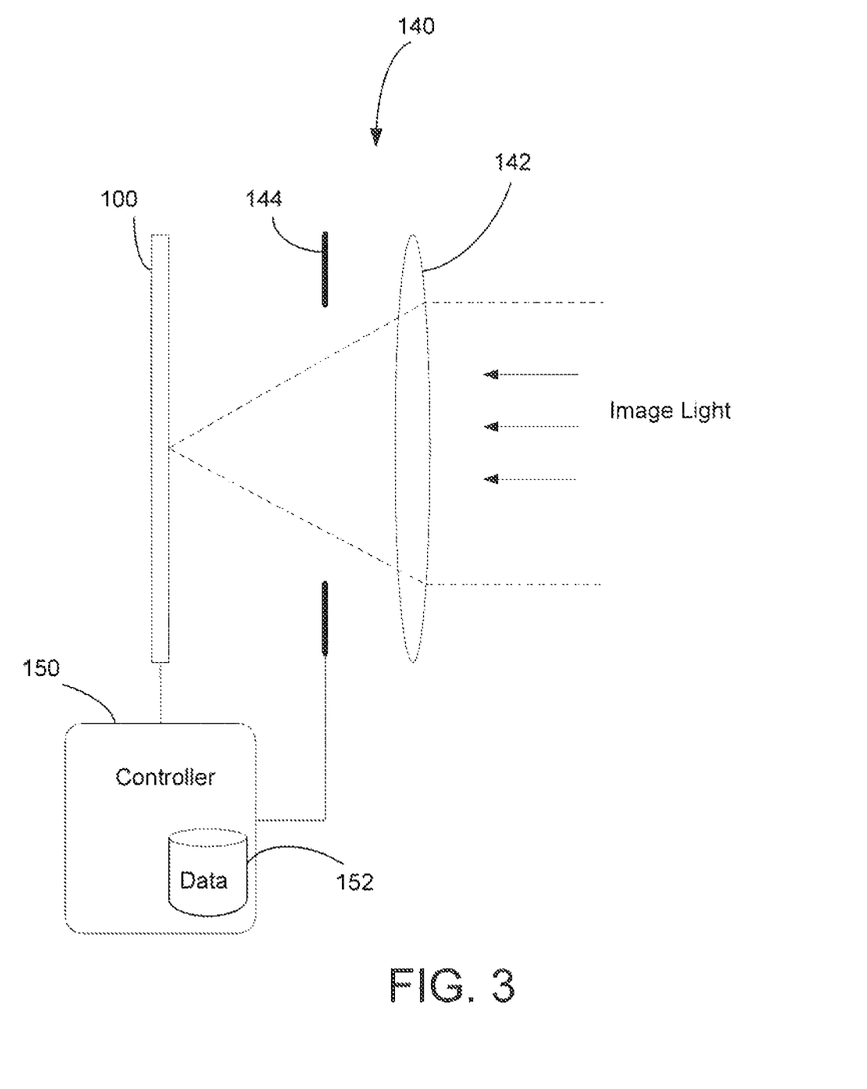
FIG. 3 is a schematic view of an imaging system using the memory array of FIG. 1 for capturing two-dimensional images.

FIG. 3 shows a system 140 utilizing the memory array 100 for 2-D imaging. The system includes optical components, such as lenses 142, for focusing image light onto the memory array 100 (viewed from its side), and a shutter 144 that can be opened to allow the image light to reach the memory array, or closed to block the image light. The imaging operation is controlled by a controller 150, which has the necessary programming, software, hardware, electronic circuits, data storage, and electric connections for controlling the operations of the components of the system.

To initiate an imaging operation, the controller 150 opens the shutter 144, and provides the operating voltage to the memory cells of the memory array 100 during the light exposure. After a desired exposure time, the controller 150 closes the shutter 144. The controller 150 then performs a read operation to detect the resistance of each memory cell in the memory array 100, and stores the data in a storage device 152. The controller 150 then applies a reset voltage to the memory cells to reset them to a pre-exposure state so that the memory array 100 is ready for the next imaging operation.

Figure 4:
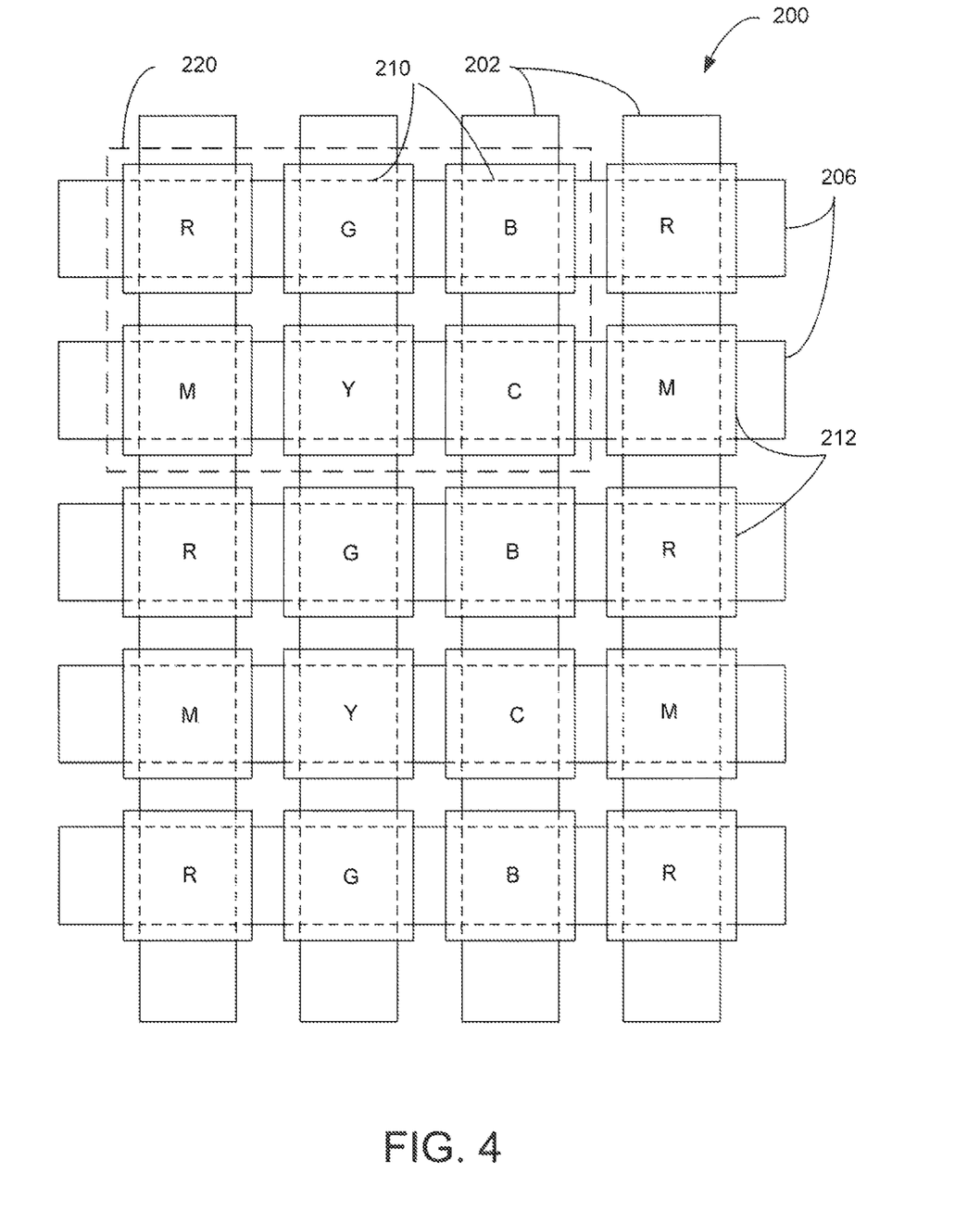
FIG. 4 is a schematic top view of a memory array with color filters disposed over optoelectronic memory cells for capturing color images.

FIG. 4 shows another embodiment of an optoelectronic memory array 200 that is capable of capturing color images. The memory array 200 has a crossbar structure similar to the memory array 100 of FIG. 1, with a first group of electrodes 202 intersecting a second group of electrodes 206 to form a plurality of intersections, and with optoelectronic memory cells 210 formed at the intersections. In this embodiment, as color filter 212 is disposed over each memory cell 210 such that only light of a selected color will enter the memory cell and be detected in the way described above. The mentors cells 210 may be arranged into groups, with each group having different filter colors, such that each group functions as one color pixel for image capturing. For instance, three adjacent memory cells may form a group, and be coupled with red, green, and blue (RGB) filters, respectively. Instead of having only three primary colors, in some embodiments more than three color filters can be used for each pixel to extend the color gamut available and to enhance the accuracy of color detection. For example, as illustrated in FIG. 4, a pixel 220 may contain 6 memory cells, three of them have red (R), green (G), and blue (B) filters, and the other three have cyan (C), yellow (Y), and magenta (M) filters, respectively. Even with multiple memory cells forming one color pixel, the pixel 220 can still be significantly smaller than pixels of conventional CCD or CMOS devices, due to the possible nanoscale dimensions of the memory cells 210.

The coupling of filters with memory cells is not limited to detection of visible colors but may be used for non-visible spectral ranges such IR and UV. For instance, an IR filter may be coupled with a memory cell that has its photoactive layer formed of an IR-sensitive material that can absorb IR light and generate charge carriers.

Figure 5A:
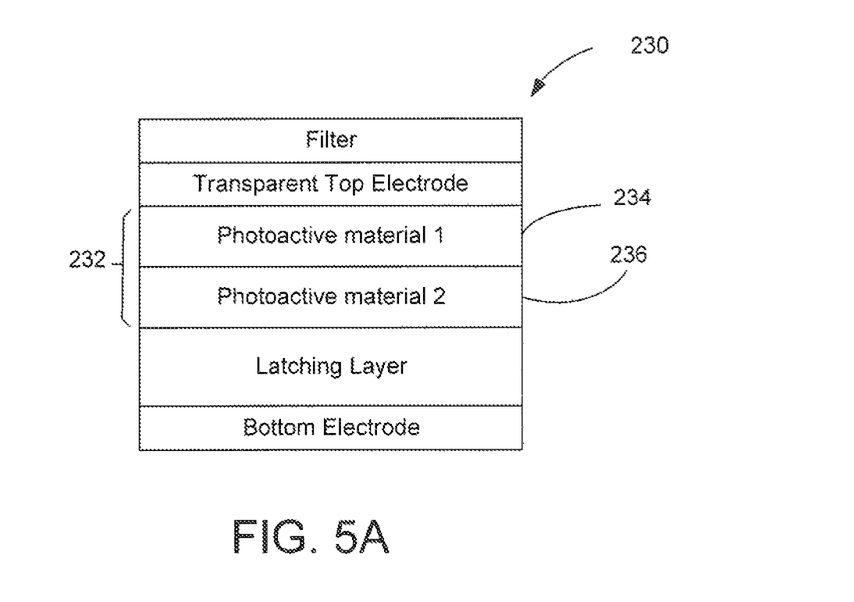
FIGS. 5A and 5B are schematic cross-sectional views of two arrangements of utilizing two or more photoactive materials in the memory cells to achieve extended spectral ranges of absorption.
Figure 5B:
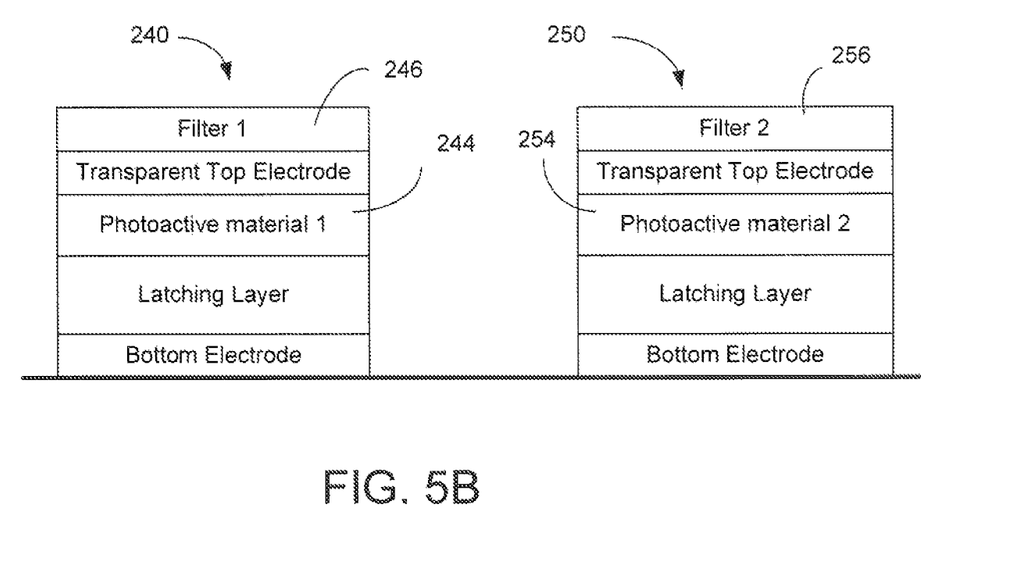

In some applications it may be desirable to have memory cells that can detect a wide range of light spectrum. FIGS. 5A and 5B show two arrangements that can be used to effectively expand the light detection spectral range of memory cells in a memory array. In the embodiment of FIG. 5A, a memory cell 230 has a photoactive layer 232 formed of two layers 234, 236 of different photoactive materials. The two photoactive materials have different light absorption spectral ranges, such as visible and IR, and the two ranges may or may not overlap. The two different photoactive material layers 234, 236 are stacked together, so a photon not absorbed by the upper layer 234 ma reach the second layer 236 and be absorbed therein. This allows the memory cell 230 to detect photons in both spectral ranges. In this regard, in a vertical stack like the one in FIG. 5A, the top photoactive material layer may be transparent to the wavelength range where the underlying photoactive material layer performs its function (i.e., the top layer may have a wider band gap compared to the bottom layer). It should be noted that the concept of combining different photoactive materials in one cell is not limited to only two photoactive materials, and three or more layers of different photoactive materials with different absorption bands may be stacked together in the same memory cell to achieve wide spectral absorption.

In contrast, FIG. 5B shows an arrangement in which multiple memory cells 240 and 250 are used in combination to achieve a desired wide spectral range of detection. The two memory cells 240 and 250 may be disposed close to each other, such as at two adjacent intersections in the crossbar structure of FIG. 1. The photoactive layer 244 of the memory cell 240 and the photoactive layer 254 of the memory cell 250 are formed of different photoactive materials that have different absorption bands. In this regard, each of the photoactive layers 244 and 254 may be formed of a single type of photoactive material, or have stacked layers of different photoactive materials as described above in connection with FIG. 5A. When used together, the two memory cells provide a combined spectral detection range that is wider than the range of either one. To enhance their spectral separation, the memory cells 240 and 250 may have filters 246 and 236, respectively, with each filter selected for passing the light in the range to be detected by the photoactive material or materials of that memory cell. The concept of using multiple side-by-side memory cells to achieve a wide combined detection range is not limited to two memory cells. For instance, a compact spectrometer may be constructed by having a plurality of memory cells, each of which has a. photoactive material tailored for a specific spectral range of absorption and may have a filter for clearly defining that spectral range. The spectral ranges of the memory cells may span differ parts of the light spectrum such as infrared, visible, and UV. In this way, the spectral distribution of the light to be measured can be obtained easily h a single exposure of the compact spectrometer to the light.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. An optoelectronic memory cell comprising:
a first electrode comprising a conductive material transparent to light;
a photoactive layer to absorb light transmitted through the first electrode and to generate charge carriers from the absorbed light;
a latching layer comprising a dopant species and having a resistance determined by a distribution of the dopant species within the latching layer, the resistance to be altered by a redistribution of the dopant species, the redistribution to be provided by the generated charge carriers,
a second electrode in physical contact with the latching layer to provide an electrical conduction path through the optoelectronic memory cell.

2. An optoelectronic memory cell as in claim 1, wherein the latching layer dopant species comprises one or more of a cation, an anion, and a vacancy, the dopant species to be moved within the latching layer under an influence of an electric field produced by the generated charge carriers to provide the redistribution.

3. An optoelectronic memory cell as in claim 2, wherein the latching layer further comprises a metal oxide and the dopant species comprises an oxygen vacancy within the metal oxide.

4. An optoelectronic memory cell as in claim 3, wherein the metal oxide comprises titanium oxide.

5. An optoelectronic memory cell as in claim 1, wherein the photoactive layer comprises two different photoactive materials.

6. An optoelectronic memory cell as in claim 1, wherein the memory cell has a width less than a wavelength of the light to be detected.

7. An optoelectronic memory cell as in claim 1, wherein the conductive material of the first electrode comprises a conductive metal oxide.

8. An optoelectronic memory cell as in claim 1, further including a filter disposed over the first electrode.

9. An optoelectronic memory cell as in claim 1, wherein the latching layer further comprises a semiconductor and the dopant species comprises one or both of an electron donor impurity or an electron acceptor impurity within a lattice of the semiconductor, the dopant species to be moved by dopant drift within the lattice under an influence of an electric field produced by the generated charge carriers to provide the redistribution.

10. An optoelectronic memory array comprising:
a first group of conductive nanowires running in a first direction;
a second group of conductive nanowires running in a second direction and intersecting the first group of nanowires; and
a plurality of memory cells formed at intersections of the first and second groups of nanowires, each memory cell having a first electrode comprising a nanowire of the first group, a second electrode comprising a nanowire of the second group, a photoactive layer and a latching layer disposed between the first and second electrodes, the first electrode further comprising a transparent conductive material, the photoactive layer comprising a photoactive material to absorb light transmitted through the first electrode and to generate charge carriers from the absorbed light, the latching layer comprising a dopant species and having a resistance determined by a distribution of the dopant species within the latching layer, the resistance to be altered by a redistribution of the dopant species, the redistribution to be provided by the generated charge carriers,
wherein, in a memory cell of the plurality, the first electrode is in contact with the photoactive layer, the photoactive layer is in contact with the latching layer, and the latching layer is in contact with the second electrode to provide an electrical conduction path through the memory cell.

11. An optoelectronic memory array as in claim 10, wherein the latching layer dopant species comprises one or more of a cation, an anion, and a vacancy, the dopant species to be moved within the latching layer under an influence of an electric field produced by the generated charge carriers to provide the redistribution.

12. An optoelectronic memory array as in claim 11, wherein the latching layer further comprises a metal oxide and the dopant species comprises an oxygen vacancy within the metal oxide.

13. An optoelectronic memory array as in claim 12, wherein the metal oxide comprises titanium oxide.

14. An optoelectronic memory array as in claim 10, wherein the photoactive layer comprises two different photoactive materials.

15. An optoelectronic memory array as in claim 10, wherein the first electrode further comprises a conductive metal oxide.

16. An optoelectronic memory array as in claim 10, wherein each memory cell has a color filter disposed over its first electrode.

* * * * *

UNITED STATES PATENT AND TRADEMARK OFFICE
CERTIFICATE OF CORRECTION

| | | |
|---|---|---|
| PATENT NO. | : 8,546,898 B2 | Page 1 of 1 |
| APPLICATION NO. | : 13/259196 | |
| DATED | : October 1, 2013 | |
| INVENTOR(S) | : Lars Thylen et al. | |

It is certified that error appears in the above-identified patent and that said Letters Patent is hereby corrected as shown below:

On the Title page, in item (22), PCT Filed, in column 1, line 1, delete "Sep. 29, 2009" and insert -- Oct. 29, 2009 --, therefor.

Signed and Sealed this
Eighteenth Day of February, 2014

Michelle K. Lee
*Deputy Director of the United States Patent and Trademark Office*